(12) United States Patent
Chesser et al.

(10) Patent No.: US 6,981,543 B2
(45) Date of Patent: Jan. 3, 2006

(54) MODULAR CAPILLARY PUMPED LOOP COOLING SYSTEM

(75) Inventors: Jason B. Chesser, Hillsboro, OR (US); Barrett M. Faneuf, Lakewood, WA (US); Stephen W. Montgomery, Federal Way, WA (US)

(73) Assignee: Intel Corporation, Santa Clara, CA (US)

( * ) Notice: Subject to any disclaimer, the term of this patent is extended or adjusted under 35 U.S.C. 154(b) by 232 days.

(21) Appl. No.: 09/957,792

(22) Filed: Sep. 20, 2001

(65) Prior Publication Data

US 2003/0051859 A1 Mar. 20, 2003

(51) Int. Cl.
*F28D 15/00* (2006.01)
*F28F 7/00* (2006.01)
*H01K 7/20* (2006.01)
*H01L 23/34* (2006.01)

(52) U.S. Cl. .................. 165/104.26; 165/46; 165/80.3; 165/104.13; 165/104.33; 165/121; 165/122; 361/687; 361/700; 257/715

(58) Field of Classification Search ............ 165/104.26, 165/80.3, 104.33, 121, 122, 104.13; 361/687, 361/700; 257/715
See application file for complete search history.

(56) References Cited

U.S. PATENT DOCUMENTS

| | | | |
|---|---|---|---|
| 4,470,450 A | * | 9/1984 | Bizzell et al. ......... 165/104.25 |
| 4,476,922 A | * | 10/1984 | Heilig et al. ........... 165/104.25 |
| 4,867,235 A | | 9/1989 | Grapes et al. |
| 4,883,116 A | * | 11/1989 | Seidenberg et al. .... 165/104.26 |
| 4,890,668 A | | 1/1990 | Cima |

(Continued)

FOREIGN PATENT DOCUMENTS

| | | |
|---|---|---|
| EP | 0580412 A1 | 1/1994 |
| FR | 2 813 662 | 3/2002 |
| GB | 2 190 737 A | 5/1986 |
| JP | 09061074 | 7/1997 |
| JP | 2001196778 | 5/2001 |

OTHER PUBLICATIONS

Amir Faghri, Heat Pipe Science and Technology, 1995, pp. 582–625.
International Search Report, Jun. 5, 2003.
International Search Report, May 12, 2002.
PCT/US02/27857, PCT Written Opinion, May 25, 2005.

*Primary Examiner*—Henry Bennett
*Assistant Examiner*—Nihir Patel
(74) *Attorney, Agent, or Firm*—Blakely, Sokoloff, Taylor & Zafman LLP

(57) ABSTRACT

A modular capillary pump loop (CPL) cooling system and associated components. The modular CPL cooling system transfers heat from high-power circuit components, such as microprocessors disposed within computer chassis, to other locations within or external to the chassis, where the heat can be more easily removed. In various embodiments, the CPL cooling system includes one or more evaporators connected to one or more condensers via flexible liquid transport and vapor transport lines. A wicking structure, such as a volume of sintered copper, is disposed within each condenser. The wicking structure draws working fluid (e.g., water) in a liquid state into the evaporator based on a capillary mechanism and a pressure differential across a meniscus/vapor interface on an upper surface of the wicking structure. As the liquid meniscus is evaporated, additional fluid is drawn into the evaporator. The working fluid is then condensed back into a liquid in the condenser.

29 Claims, 14 Drawing Sheets

U.S. PATENT DOCUMENTS

| | | | |
|---|---|---|---|
| 4,994,937 A | | 2/1991 | Morrison |
| 5,289,694 A | | 3/1994 | Nordin |
| 5,504,924 A | | 4/1996 | Ohashi et al. |
| 5,528,454 A | | 6/1996 | Niklos |
| 5,587,880 A | * | 12/1996 | Phillips et al. ............... 361/687 |
| 5,619,486 A | | 4/1997 | Uno et al. |
| 5,673,029 A | | 9/1997 | Behl et al. |
| 5,725,049 A | | 3/1998 | Swanson et al. |
| 5,731,954 A | * | 3/1998 | Cheon ......................... 361/699 |
| 5,761,037 A | * | 6/1998 | Anderson et al. ........... 361/700 |
| 5,816,313 A | * | 10/1998 | Baker .......................... 165/41 |
| 5,924,482 A | * | 7/1999 | Edwards et al. ....... 165/104.33 |
| 5,940,270 A | | 8/1999 | Puckett |
| 5,944,092 A | * | 8/1999 | Van Oost ............... 165/104.26 |
| 6,021,049 A | | 2/2000 | Thompson et al. |
| 6,088,223 A | * | 7/2000 | Diemunsch ................ 361/690 |
| 6,115,251 A | | 9/2000 | Patel et al. |
| 6,118,654 A | * | 9/2000 | Bhatia ......................... 361/687 |
| 6,141,211 A | * | 10/2000 | Strickler et al. ............ 361/685 |
| 6,166,907 A | * | 12/2000 | Chien .......................... 361/699 |
| 6,167,948 B1 | * | 1/2001 | Thomas ................. 165/104.26 |
| 6,209,625 B1 | * | 4/2001 | Guo ....................... 165/104.21 |
| 6,227,286 B1 | | 5/2001 | Katsui |
| 6,257,323 B1 | | 7/2001 | Kuo |
| 6,269,865 B1 | * | 8/2001 | Huang ................... 165/104.26 |
| 6,317,322 B1 | * | 11/2001 | Ueki et al. ................... 361/700 |
| 6,337,794 B1 | | 1/2002 | Agonafer et al. |
| 6,351,381 B1 | | 2/2002 | Bilski et al. |
| 6,366,461 B1 | * | 4/2002 | Pautsch et al. ............. 361/690 |
| 6,388,882 B1 | * | 5/2002 | Hoover et al. .............. 361/704 |
| 6,419,007 B1 | * | 7/2002 | Ogawara et al. ........... 165/80.3 |
| 6,473,297 B1 | | 10/2002 | Behl et al. |
| 6,496,364 B1 | * | 12/2002 | Medin et al. ................ 361/686 |
| 6,536,510 B2 | * | 3/2003 | Khrustalev et al. .... 165/104.33 |
| 6,626,231 B2 | * | 9/2003 | Cluzet et al. ................. 165/41 |
| 6,643,132 B2 | * | 11/2003 | Faneuf et al. ............... 361/700 |
| 6,690,575 B1 | * | 2/2004 | Banton et al. .............. 361/690 |
| 6,693,797 B2 | * | 2/2004 | Faneuf et al. ............... 361/689 |
| 6,776,221 B2 | * | 8/2004 | Montgomery et al. ........ 165/46 |
| 6,804,117 B2 | * | 10/2004 | Phillips et al. .............. 361/700 |
| 6,836,407 B2 | * | 12/2004 | Faneuf et al. ............... 361/687 |
| 6,889,754 B2 | * | 5/2005 | Kroliczek et al. ...... 165/104.26 |
| 2002/0149909 A1 | * | 10/2002 | Konstad et al. ............. 361/687 |

\* cited by examiner

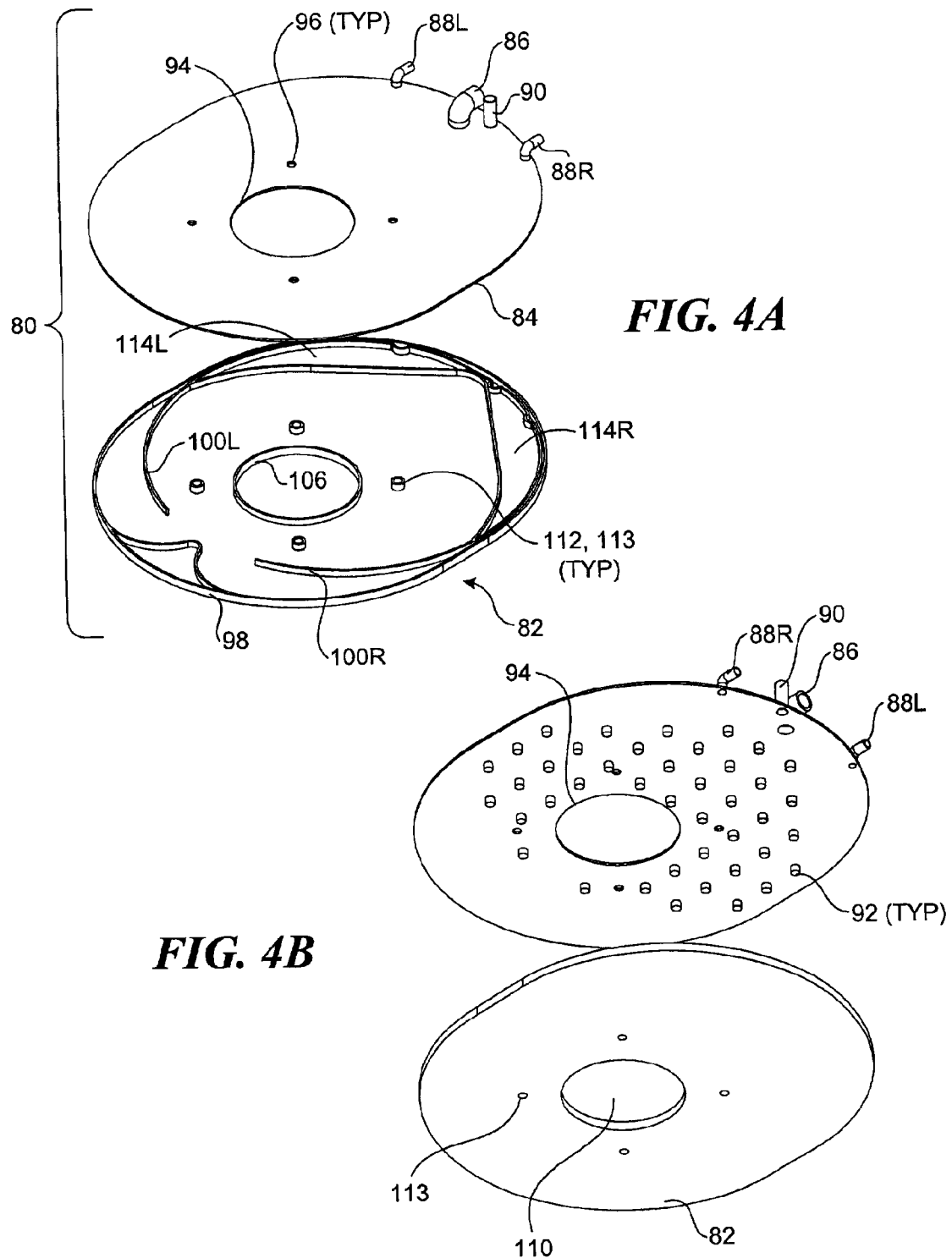

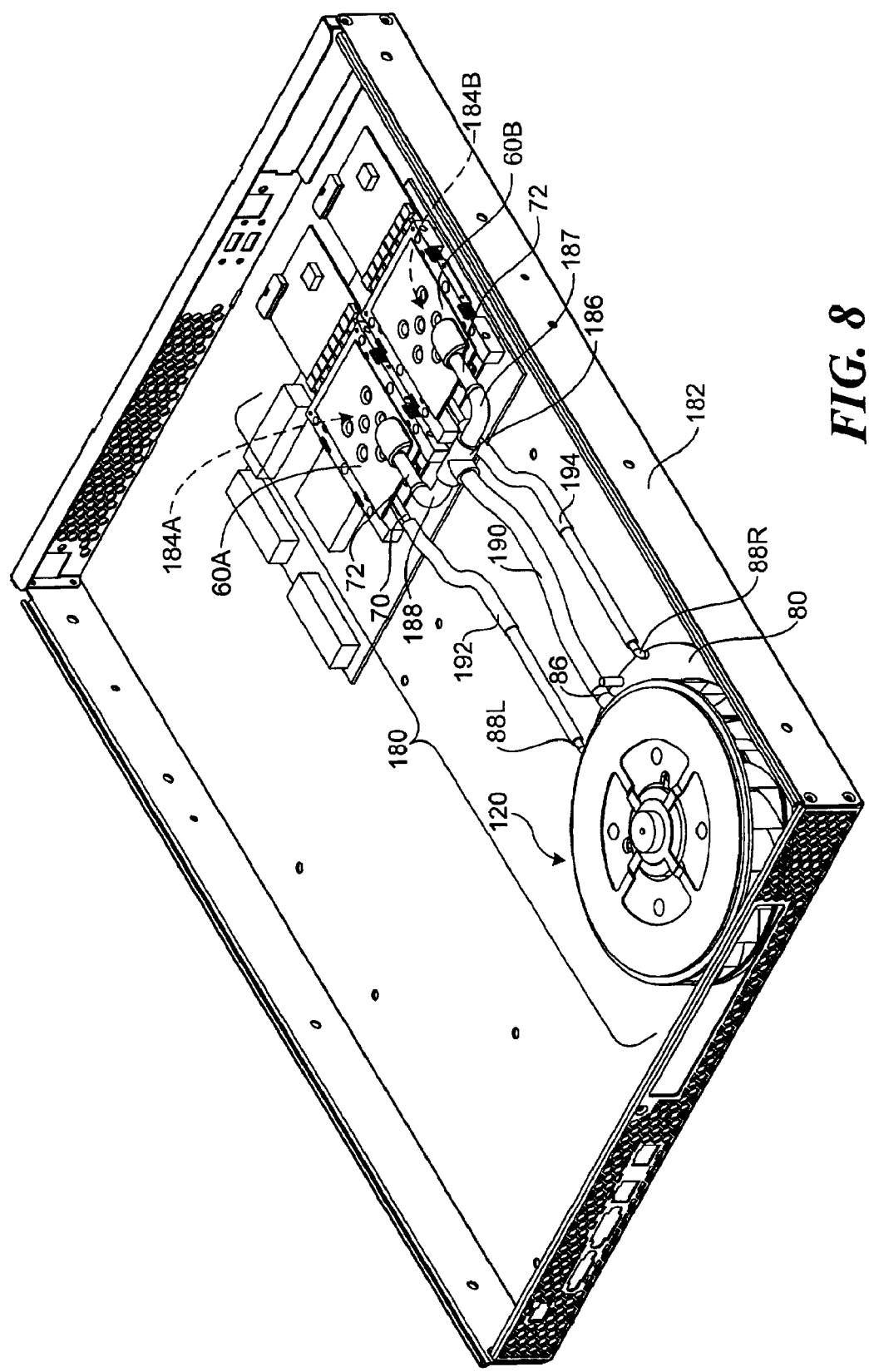

MODULAR CAPILLARY PUMPED LOOP COOLING SYSTEM

BACKGROUND OF THE INVENTION

1. Field of the Invention

The present invention concerns cooling systems for computer systems in general, and capillary pumped loop cooling systems and components adapted for high-density computer servers in particular.

2. Background Information

Recent market demands have led the computer industry to develop computer systems with increased circuit densities. For example, many hardware vendors, such as Intel, Hewlett-Packard, IBM, Compaq, and Dell, offer high-density rack-mounted servers that enable a large number of servers to be housed within a single standardized rack. The chassis for these rack-mounted servers are configured to have a specific form factor that is designed to the standardized rack the servers are to be installed in. In one configuration, an ultra-thin form factor, known as the "1U" form factor, is used. Under the 1U form factor, the chassis height for each server is only 1.75 inches. In another configuration, known as the "2U" form factor, the chassis height for each server is 3.5 inches.

In addition to increased circuit density, the components in these computer servers are operating at higher and higher frequencies. For example, recent microprocessor clock rates typically exceed 1.5 gigahertz. As a result, these components, especially microprocessors, generate a large amount of heat, which must be removed from the chassis so that the components do not overheat. In conventional computer systems, this heat is generally removed using forced air convection, which transfers the heat from the heat-producing circuit components by using one or more "muffin" fans that are disposed within or coupled to the chassis to draw air over the components through the chassis. In addition, heat sinks are often mounted to various high-power circuit components, such as CPUs, to enhance natural and forced convection heat transfer processes.

In general, the rate at which heat is removed from a component is a function of the component's surface area and the velocity of the air flowing over that surface area, coupled with the temperature differential between the component surface and the air. Oftentimes, heat sinks are mounted on high temperature components to assist in removing heat from these components. For example, heat sinks comprising an array of fingers having a height of approximately 1–2 inches are commonly used to cool microprocessors in desktop systems, workstations, and pedestal-mounted servers. The heat sinks provide significantly greater surface areas than the components they are mounted to.

The low profiles of the 1U and 2U form factors create several problems for thermal engineers. Due to internal height limitations and airflow considerations, the use of heat sinks is generally restricted to lower profile heat sinks, which are much less efficient than the taller heat sinks discussed above. Also, in order to provide sufficient cooling via forced air convection, there needs to be adequate airflow passages. Although heat sinks are advantageous in many instances, they create significant airflow restrictions that greatly reduce the velocity of airflow through a computer chassis. They also take up space that may be used by other system components. Additionally, since the area of a fan blade is roughly proportional to the amount of airflow generated by a muffin fan (when fans having different diameters are rotated at the same speed), the smaller fans used in 1U and 2U form factors draw less air that the larger fans found in computer system chassis having larger form factors. As a result, the use of heat sinks in multiple microprocessor 1U configurations may be prohibited entirely. In other cases, it is necessary that the multiple processors be aligned to provide adequate airflow over all of the microprocessors, which may limit the circuit design.

To address the foregoing problems, thermal cooling systems incorporating a large planar heat pipe have been proposed for transporting the energy from another location in 1U chassis where the energy may be more easily dissipated. [Please describe a few details of the heat pipe system, but limit to 1 additional page]

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4A is a topside exploded isometric view of a first exemplary slim-line condenser in accordance with the present invention;

FIG. 4B is an underside isometric exploded view of the condenser of FIG. 4A;

FIG. 8 is an isometric view of a 1U chassis computer server in which a first exemplary CPL cooling system embodiment of the present invention is implemented;

DETAILED DESCRIPTION OF THE ILLUSTRATED EMBODIMENTS

In the following description, numerous specific details are provided to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention concerns a modular capillary pump loop (CPL) thermal cooling system that transfers heat from high-power circuit components (e.g., microprocessors) disposed within a computer chassis to other locations within or external to the chassis, where the heat can be more easily removed through condensing the CPL's working fluid. A CPL is a two-phase thermal management system that uses capillary forces to pump the working fluid from a heat acquisition device(s) (e.g., an evaporator) to a heat radiation device(s) (e.g., a condenser).

Figure 1:
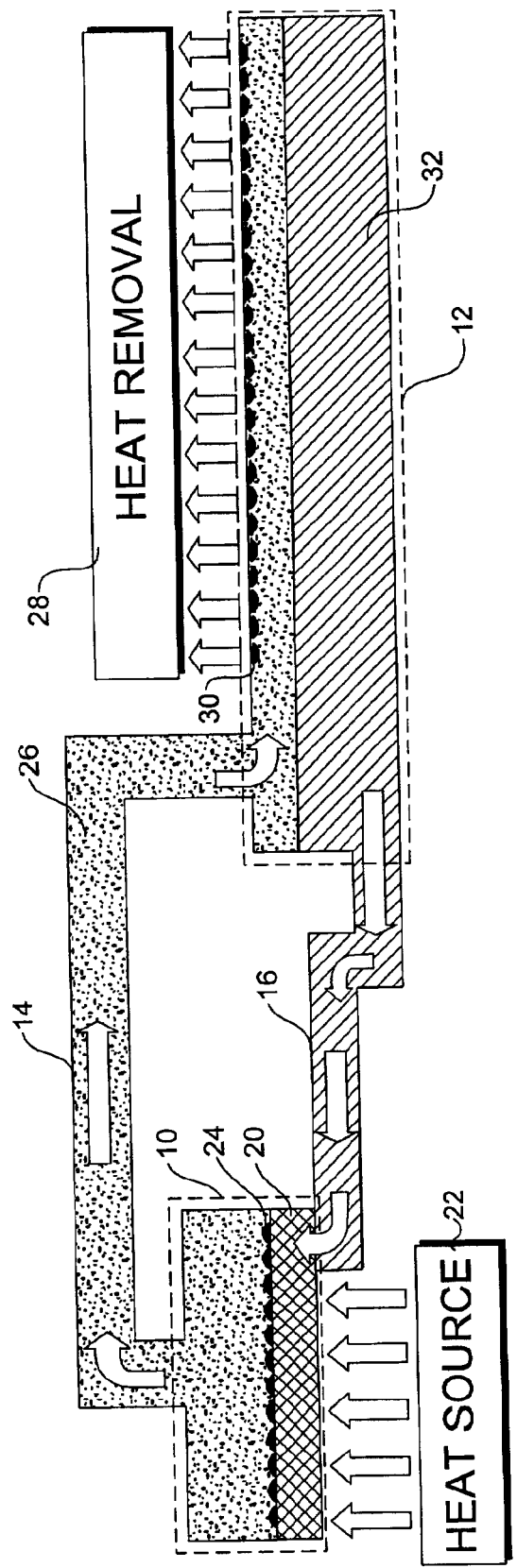
FIG. 1 is a schematic diagram illustrating a conventional capillary pumped loop (CPL) cooling system.

A typical CPL system is shown in FIG. 1. The CPL system includes an evaporator 10 and a condenser 12 connected via a vapor transport line 14 and a liquid transport line 16. Evaporator 10 includes a wick structure 20 disposed in a lower portion thereof, and is adapter to be coupled to a heat source 22, such as a microprocessor. In the embodiment shown, condenser 12 also functions as a two-phase liquid reservoir. Optionally, the system may include one or more liquid reservoirs apart from the condenser. In other embodiments, the CPL system may also include one or more liquid subcooler and/or isolators (not shown).

The CPL system operates in the following manner. Heat produced by heat source 22 is received by the lower portion of evaporator 10, causing liquid held in a meniscus layer 24 at the top of wick structure 20 to evaporate into vapor 26. Vapor 26 is then caused to be transported via vapor transport line 14 to condenser 12 by means of a temperature-induced pressure gradient caused by a difference in the temperature of the vapor in vaporizer 10 (high temperature) and the vapor in condenser 12 (lower temperature). Condenser 12 is maintained at a lower temperature by means of heat removal 28, which typically will by accomplished through a combination of forced convection and/or heat transfer fins on the condenser. Accordingly, upon entering the lower-temperature condenser 12, vapor 26 condenses into condensate 30, comprising liquid drops that are formed on the ceiling and walls of the condenser. As the condensate drops increase in size, their weight overcomes their surface tension, causing them to eventually fall into liquid 32, which is contained at the bottom portion of condenser 12. Liquid 32 is then transported via liquid transport line 16 back to evaporator 10 to complete the cycle.

As is name suggests, a capillary pumped loop uses a capillary action to cause the liquid in the loop to be pumped. This is accomplished through the use of wicking structure 20. More specifically, a pressure differential is produced at the liquid-vapor meniscus boundary at top of the wicking structure. This pressure differential causes liquid 32 to be drawing into wicking structure 20 as liquid is evaporated at the top of the wicking structure into vapor 26.

As liquid 32 is evaporated into vapor 26, heat is transferred from heat source 22 at a rate that is based on the latent heat of vaporization of the liquid and the flow rate of the liquid through the loop. In one embodiment, the liquid is water, which has a latent heat of vaporization of [please provide value]. In a similar manner, as the vapor is condensed back to a liquid in condenser 12, heat is removed as a function of the latent heat of vaporization of the liquid and the flow rate of the liquid through the loop.

According to one aspect of the invention, CPL embodiments are provided that are modular, wherein multiple components may be used in the CPL loop, as appropriate, and various system components may be replaced by other system components that provide similar functionality. For example, the module CPL cooling systems provided by the invention may include various types of evaporators, condensers, reservoirs and transport line configurations, and may be configured operate in single and multi-processor computer systems.

Figure 2A:
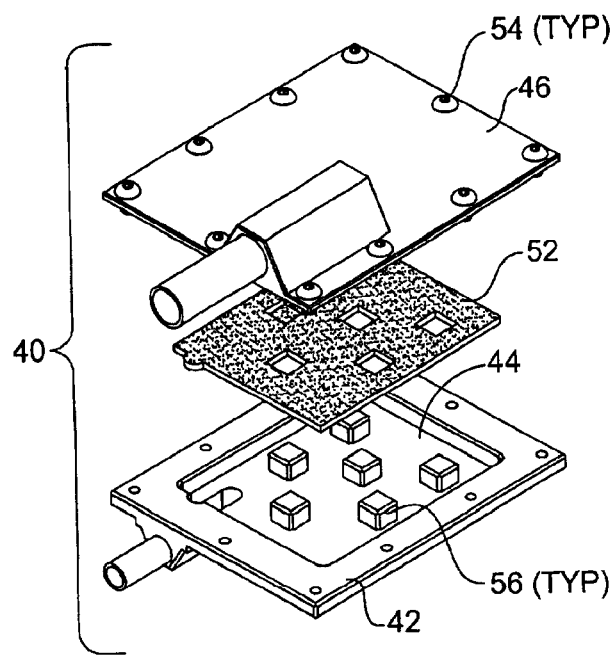
FIG. 2A is an exploded isometric view of a first exemplary evaporator embodiment in accordance with the present invention.
Figure 2B:
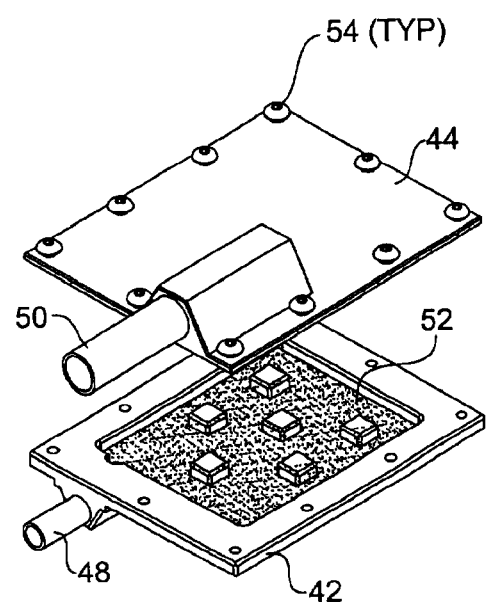
FIG. 2B is an isometric view illustrating a wicking structure disposed within the base of the evaporator shown in FIG. 2A.
Figure 2C:
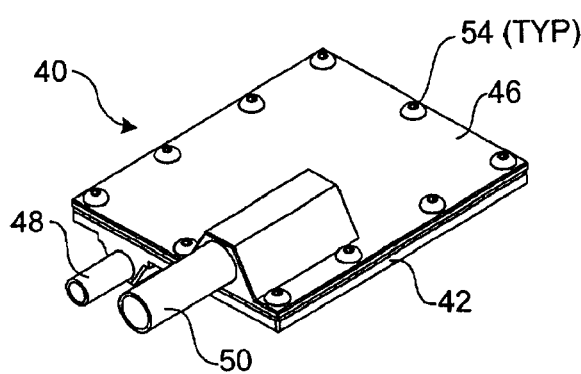
FIG. 2C is an isometric view of the embodiment of FIG. 2A upon assembly.

An evaporator 40 according to a first exemplary evaporator embodiment of the invention is shown in FIGS. 2A–C. Evaporator 40 comprises a two-part shell configuration including a base 42 having a cavity 44 covered by a top cover 46 so as to form a sealed volume. Liquid is provided to the evaporator via an liquid inlet port 48, while vapor exits the evaporator via a vapor outlet port 50. The evaporator further includes a wicking structure 52 disposed in a lower portion of cavity 44. In one embodiment, wicking structure 52 comprises a volume of a sintered metal powder, which provides a high capillary pumping capability. In lower power applications (i.e., applications that can use relatively low liquid flow rates), wicking structure 52 may comprise a wire mesh. When a sintered metal power is used, the lower portion of cavity 44 may be filled with the powder and then heated, producing a sintered metal powder layer that is integral to base 42, as shown in FIG. 2B.

Preferably, the materials used for the components in the evaporator, as well as other components in the CPL system, should be selected to be compatible with the working fluid used in the system. In one embodiment, the working fluid comprises water. Accordingly, the components of the evaporator and other system components should be made of materials that will no rust or otherwise deteriorate in the presence of water. For example, in one embodiment, each of base 44 and top cover 46 are made of copper, and wicking structure 52 comprises a sintered copper powder.

Another consideration is that various embodiments discussed herein may be operated under sub-atmospheric (i.e., vacuum) conditions. By operating under reduced pressures, the boiling and condensation points of the liquid are lowered. This allows the surface of the component(s) being cooled to operate at a lower temperature. For instance, if water under atmospheric pressure is to be used, the temperature at the surface of the component being cooled, such as a microprocessor, would have to be (somewhat significantly) above the boiling point of water (212° F.). Furthermore, since heat transfer is driven by the temperature differential between interfaces, it is desired that the temperature of base 42, which will be in thermal contact with the component being cooled, be as low as possible.

In order to provide a sub-atmospheric loop, it is necessary that the various operating volumes in the loop be sealed. Therefore, top cover 46 need to be secured to a peripheral portion of base 44 so as to form a hermetic (or near-hermetic) seal. As depicted by FIGS. 2A–C, top cover 46 may be secured to base 42 using a plurality of fasteners 54. In one embodiment, a gasket may be used to ensure a hermetic seal (not shown). In another embodiment, the top cover and base may be secured using a hermetic braze or weld.

In addition to sealing considerations, structural considerations also need to be made when designing sub-atmospheric CPL systems. For example, either or both of base 44 and top cover 46 may include a plurality of posts 56 that are used to ensure that the sealed volume does not collapse when the pressure inside of the volume is reduced. Posts 56 also assist in the vaporization of the working fluid by conducting heat from the heat source.

Figure 3A:
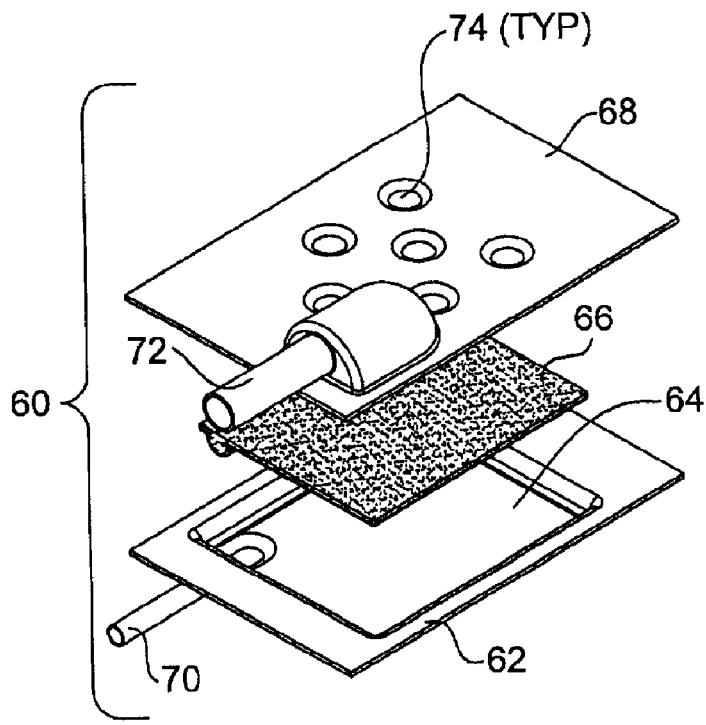
FIG. 3A is an exploded isometric view of a second exemplary evaporator embodiment in accordance with the present invention.
Figure 3B:
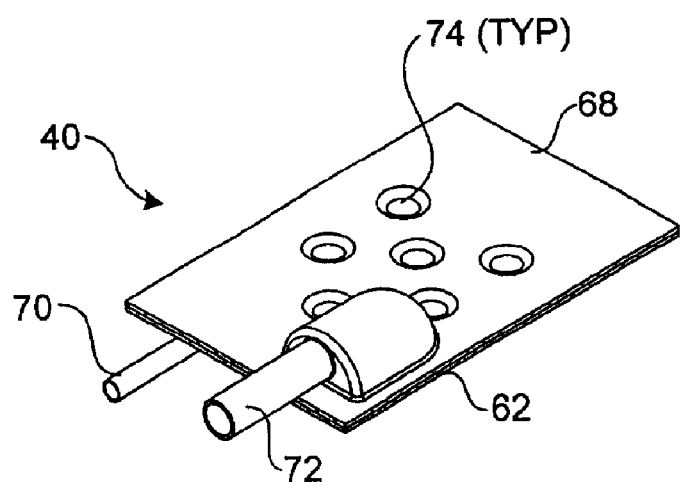
FIG. 3B is an isometric view of the embodiment of FIG. 3A upon assembly.

A second exemplary evaporator 60 embodiment is shown in FIGS. 3A–B. Evaporator 60 includes a base 62 in which a cavity 64 is defined, a wicking structure 66, a top cover 68, a liquid inlet port 70, and a vapor outlet port 72. As depicted, top cover 68 includes a plurality of dimples to strengthen the top cover and prevent it from collapsing when a vacuum is applied to evaporator 60. As before, top cover 68 may be secured to base 62 to form a sealed volume using a plurality of fasteners (not shown) or a hermetic braze or weld.

In general, each of embodiments 40 and 60 functions in a manner similar to evaporator 10 discussed above with reference to FIG. 1. The components of embodiment 40 will typically be formed using machining operations, stamping operations, and/or casting operations. The components of embodiment 60 may be formed using an appropriate sheet metal using stamping operations. Ideally, materials having good thermal conduction properties should be used, such as copper alloys.

Details of a first exemplary condenser embodiment 80 are shown in FIGS. 4A–5D. Condenser 80 includes a channeled base member 82 over which a cover plate 84 is disposed upon assembly. Cover plate 84 includes a vapor inlet port 86, a pair of liquid outlet ports 88L and 88R, and a charging port 90. As shown in FIG. 4B, in one embodiment cover plate 84 includes a plurality of posts 92 that are used to strengthen the cover plate and prevent it from collapsing when condenser 80 is used in sub-atmospheric CPL systems. The posts also act as nucleation sites for condensate formation, by effectively conducting heat out of the condenser, and provide effective entrainment traps for the vapor flowing past them. Cover plate 84 further includes a hole 94 and a plurality of fastener clearance holes 96.

Figure 4C:
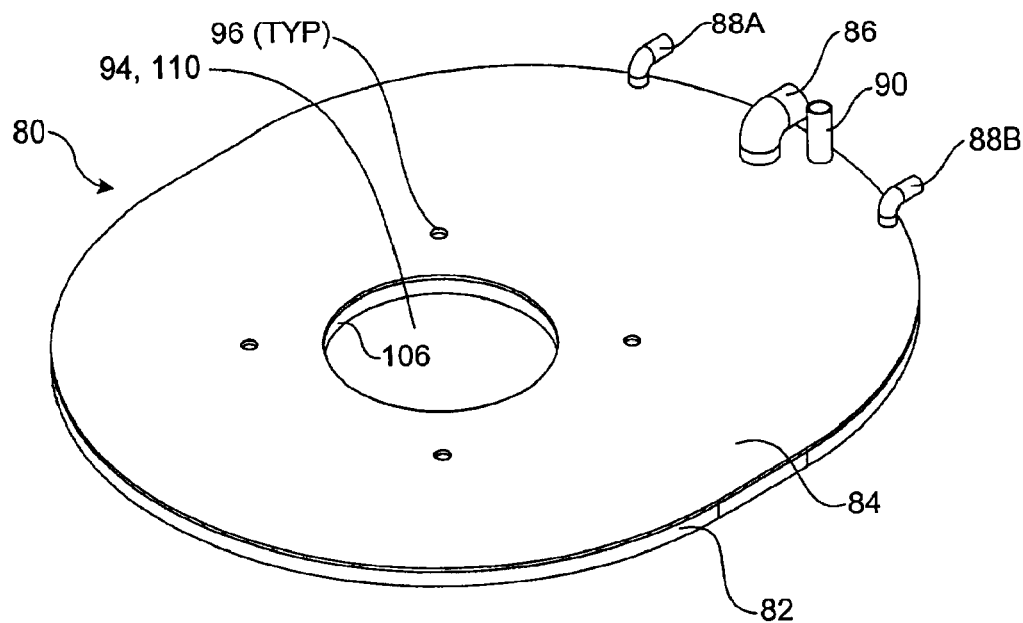
FIG. 4C is an isometric view of the condenser of FIG. 4A upon assembly.
Figure 4D:
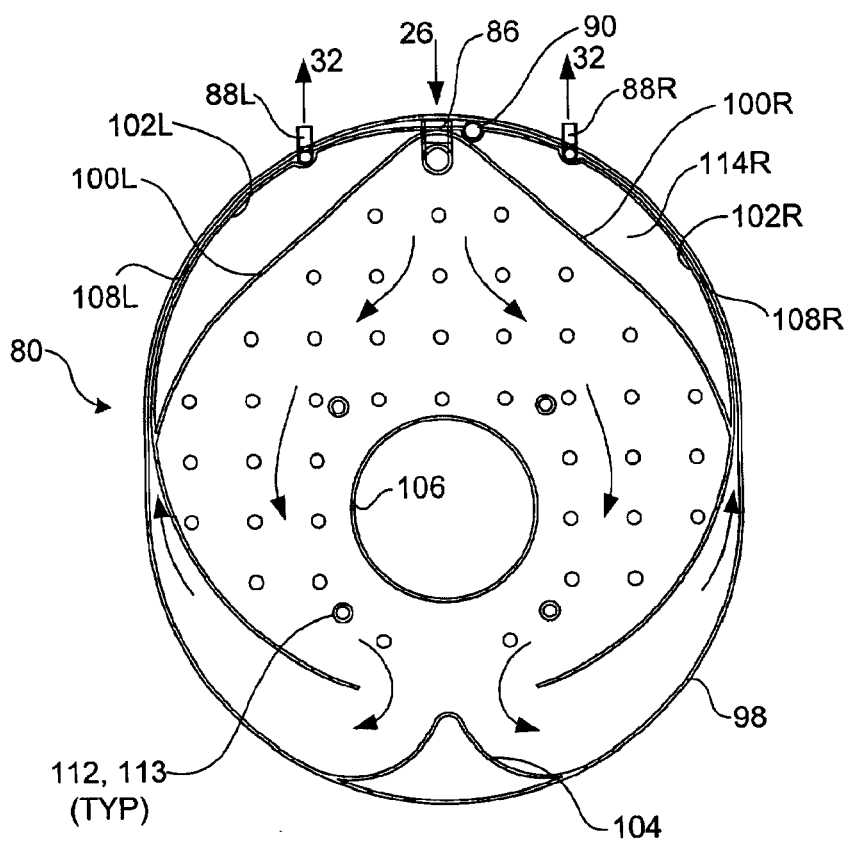
FIG. 4D is a plan view of the condenser of FIG. 4A that illustrates the flow path the working fluid takes as it passes through the condenser.

As shown in FIGS. 4A and 4D, channeled base member 82 includes a plurality walls that are configured to guide fluid condensed in a central condensing region of condenser 80 out through liquid outlet ports 88L and 88R. These walls include an external wall 98, a left inner wall 100L, a right inner wall 100R, a left capillary wall 102L, a right capillary wall 102R, a flow diverting wall 104, and a through-hole wall 106. The external wall and left and right capillary walls 102L and 102R form respective thin capillary channels 108L and 108R. Channeled base member 82 further includes a through-hole 110 and a plurality of bosses 112 configured in a hole pattern adapted to align with respective fastener holes 96 in cover plate 84; each boss includes a clearance hole 113 through which a fastener shank passes upon assembly of the condenser (fasteners not shown).

As shown in FIG. 4D, condenser 80 operates in the following manner. Vapor 26 enters the condenser via vapor inlet port 86. The vapor is then condensed on the underside of cover plate 84 and various walls of the condenser in the central condensing region creating liquid 32. Liquid 32 is then drawn out of the condenser through liquid outlet ports 88L and 88R by means of a combination of a lower pressure at the external side of the liquid outlet ports (relative to the pressure inside the condenser) and the capillary action created by capillary channels 108L and 108R.

It is noted that in one embodiment there are a pair of areas 114L and 114R in which neither vapor or liquid is present. These areas are used to thermally isolate the vapor/liquid mixture disposed in the center of the condenser from the liquid in capillary channels 108L and 108R.

Charge port 90 is used to "charge" condenser 80 with the working fluid in the CPL systems that use the condenser. It is envisioned that the condenser will be charged by holding the condenser vertical (i.e., the configuration shown in FIG. 4D) and filling the lower portion of the condenser with the working fluid. The symmetric configuration of the condenser should ensure that both capillary channels are properly charged with the working fluid. The working fluid will flow symmetrically out of the liquid outlet ports into the liquid transport line(s) and saturate the wicking structure(s) in the CPL system evaporators, thereby providing for proper charging and priming of the CPL system.

The central condensing portion of condenser 80 also serves as a reservoir when used in a CPL system. This enables steady temperature and pressure conditions to be maintained in the CPL, and is also useful to accommodate power surges.

Figure 5A:
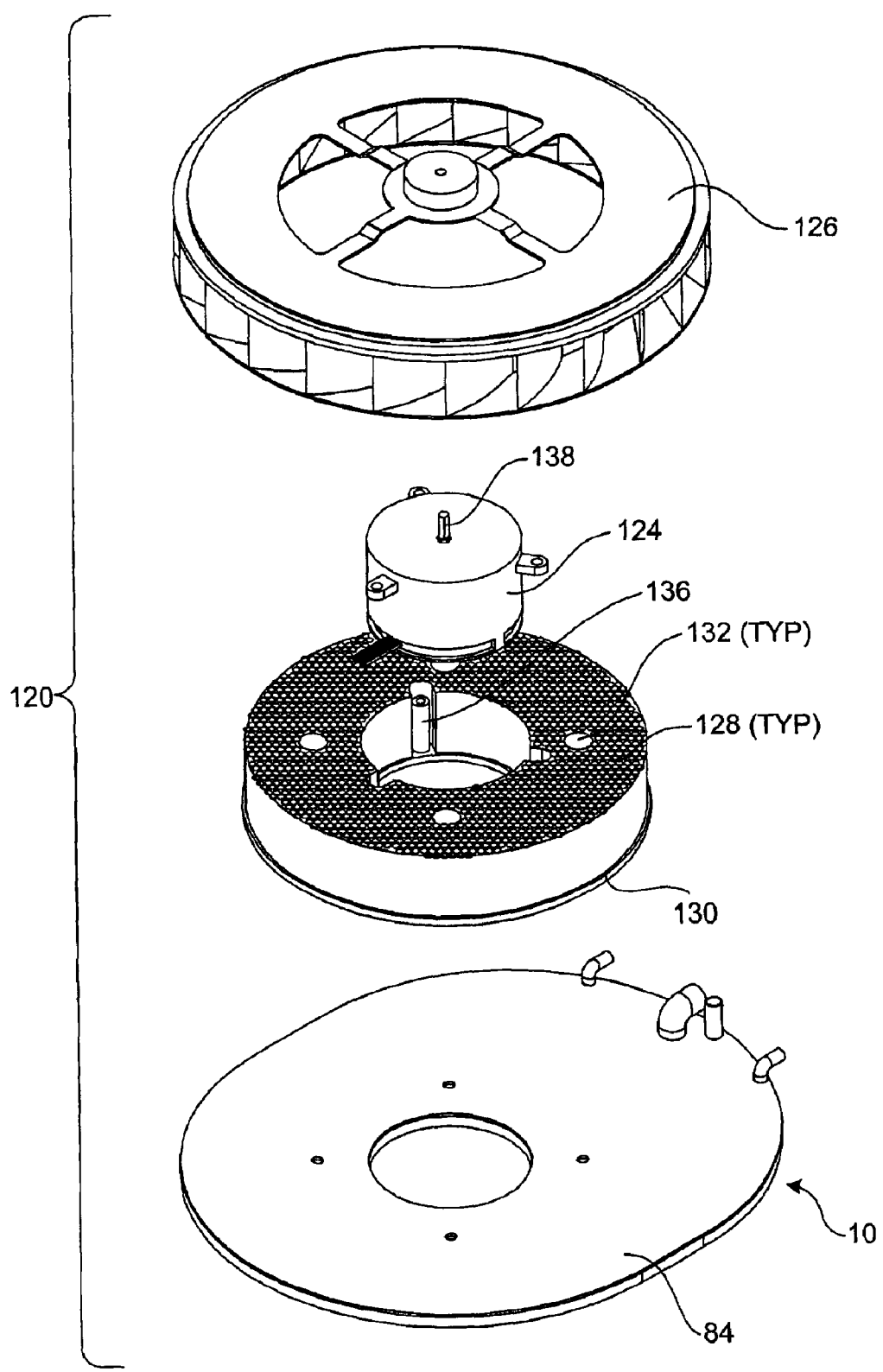
FIG. 5A is an exploded isometric view of a cooling device that includes the condenser of FIG. 4A.
Figure 5B:
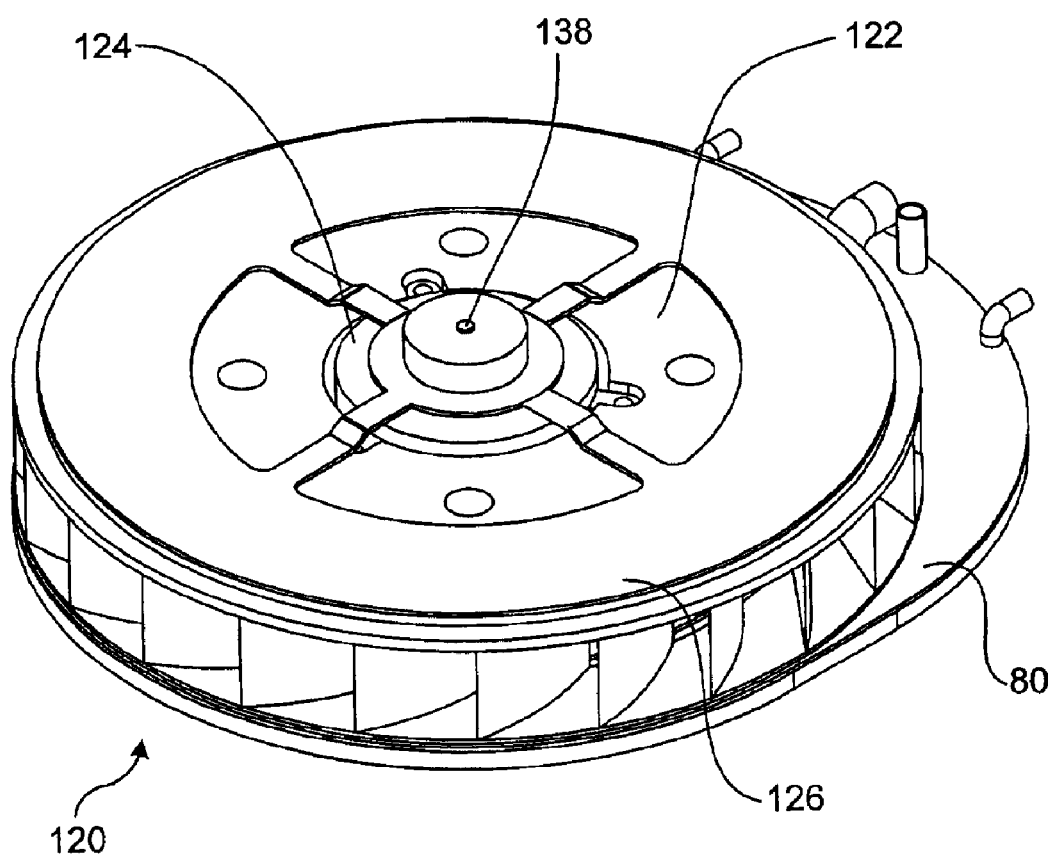
FIG. 5B is an isometric view of the cooling device of FIG. 5A upon assembly.

In order to obtain enhanced performance, condenser 80 may be coupled to a heat dissipation device, such as a heatsink. Preferably, heat removal via the heat sink will be enhanced by causing air to flow across the heatsink. An exemplary heat removal device 120 that incorporates condenser 80 and provides the foregoing functionality is shown in FIGS. 5A and 5B. Heat removal device 120 includes a heatsink 122, a motor 124, and an annular centrifugal fan rotor assembly 126 that includes a plurality of fan blades that are radially disposed about a center of the rotor. In one embodiment, heatsink 122 includes an array of pins 128 connected to a base plate 130. The heatsink is coupled to cover plate 84 by means of a plurality of fasteners (not shown), wherein the head of the fasteners are disposed within clearances 132 defined in the array of pins. Motor 124 is secured to heatsink 122 with three fasteners (not shown) that are threaded into three respective threaded standoffs 136. Annular centrifugal fan rotor assembly 126 is then secured to motor 124 at the motor's shaft 138.

Heat removal device operates in the following manner. Heat is transferred from condenser 80 via cover plate 84 to base 130 of heat sink 122. The heat then flows to the array of pins in the heat sink. As motor 124 turns centrifugal fan blade assembly 126, air is caused to flow past the array of pins, thereby cooling them. The heated air is then exhausted outward from the fan blades. If desired, the exhausted air may be directed toward a desired outlet via appropriate ducting.

Figure 6A:
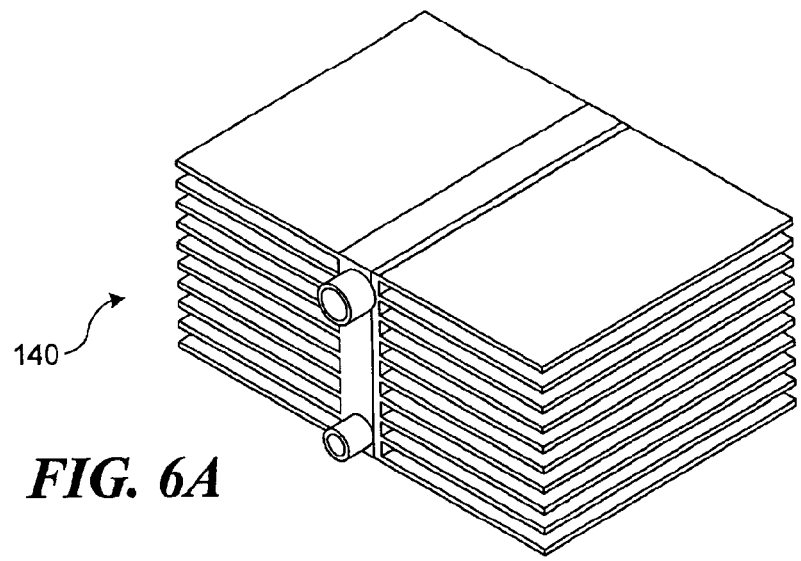
FIG. 6A is an isometric view of a second exemplary condenser in accordance with the present invention.
Figure 6B:
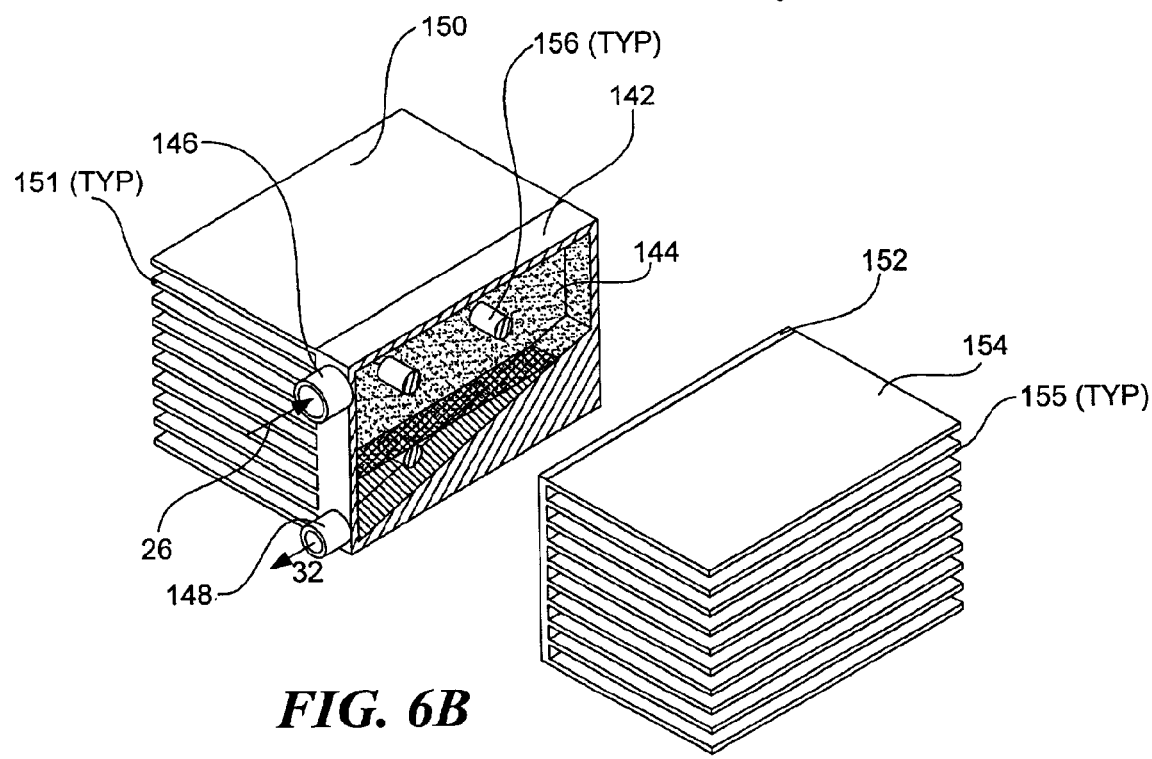
FIG. 6B is an isometric cut-away view of the condenser of FIG. 6A.

A second exemplary condenser embodiment 140 is shown in FIGS. 6A and 6B. Condenser 140 includes a body 142 including a cavity 144 into which vapor enters through a vapor inlet port 146 and out of which liquid exits through a liquid outlet port 148. In one embodiment, a heatsink 150 including a plurality of fins 151 is integrated into body 142. Optionally, a heatsink may be attached to body 142 as a separate part. A cover 152, including an integrated heatsink 154 comprising a plurality of fins 155 is disposed over cavity 144 to form an enclosed volume upon assembly of the cover to body 142. Body 142 further includes a plurality of posts 156 for structural purposes in sub-atmospheric embodiments and nucleation enhancement.

As vapor 26 enters cavity 144 through vapor inlet port 146, it condenses into droplets on the walls in the upper portion of the cavity; eventually the droplets fall to the lower portion of the cavity to form liquid 32, which exits the cavity through liquid outlet port 148. The large surface area of the fins of heatsinks 150 and 154 assist in keeping condenser 140 at a low operating temperature, increasing the efficiency of the condensing process.

Figures 7A, 7B:
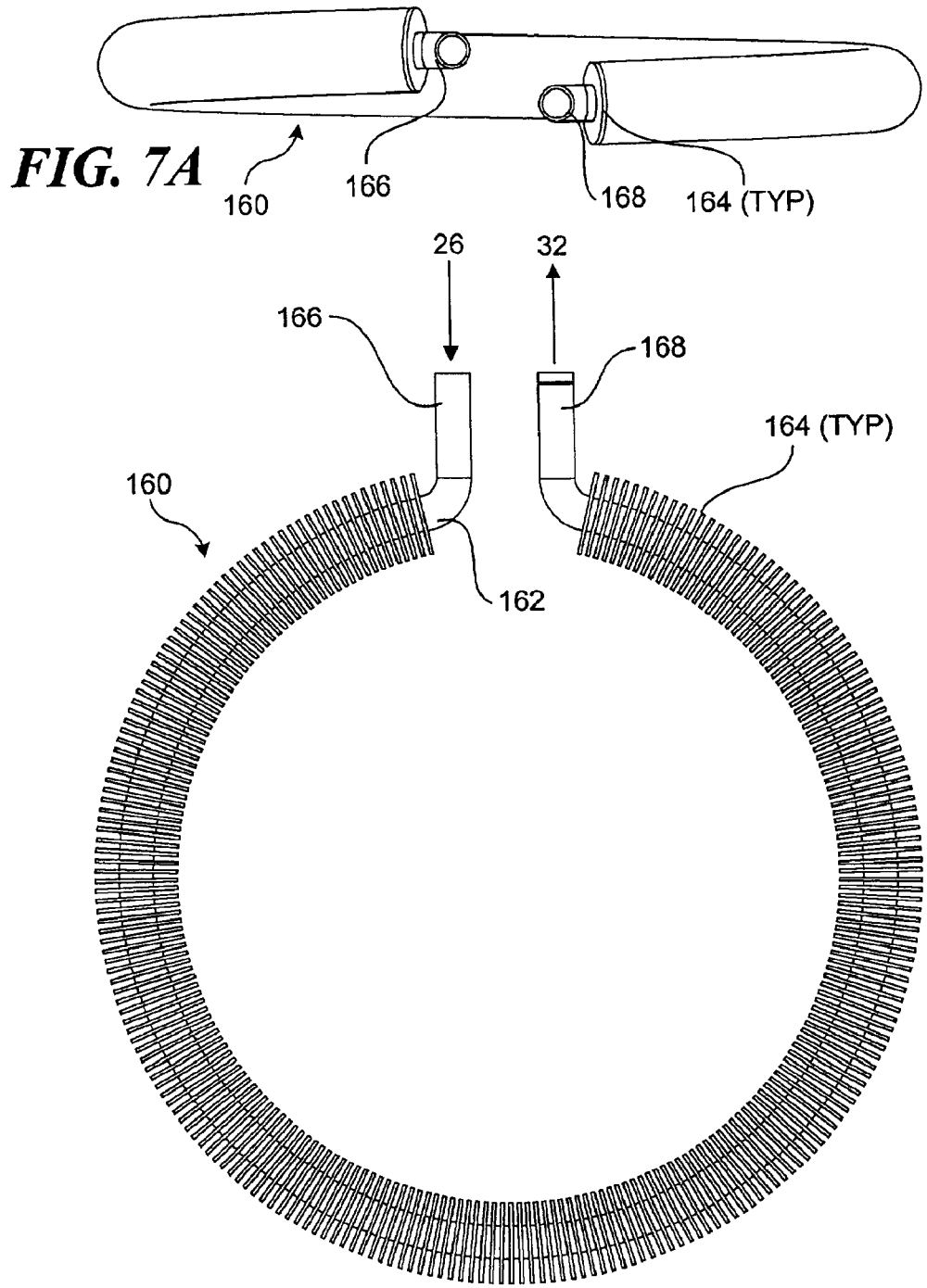
FIG. 7A is an elevational end view of a third exemplary condenser in accordance with the invention.
FIG. 7B is a plan view of the condenser of FIG. 7A.

A third exemplary condenser embodiment 160 is shown in FIGS. 7A and 7B. Condenser 160 comprises a single loop of tubing 162 having a helical configuration and a plurality of circular fins 164 axially disposed about the tubing. Condenser 160 further includes a vapor inlet port 166 and a liquid outlet port 168. During operation, vapor 26 enters vapor inlet port 166 and begins to condense on the inner walls of tubing 162. As the vapor condenses, it is converted to droplets that eventually roll down the tubing walls and collect in the lower elevation portion of the tubing (i.e., the right-hand portion of the tubing in FIG. 7A). The condensed working fluid then exits the condenser through liquid outlet port 168.

Figure 9:
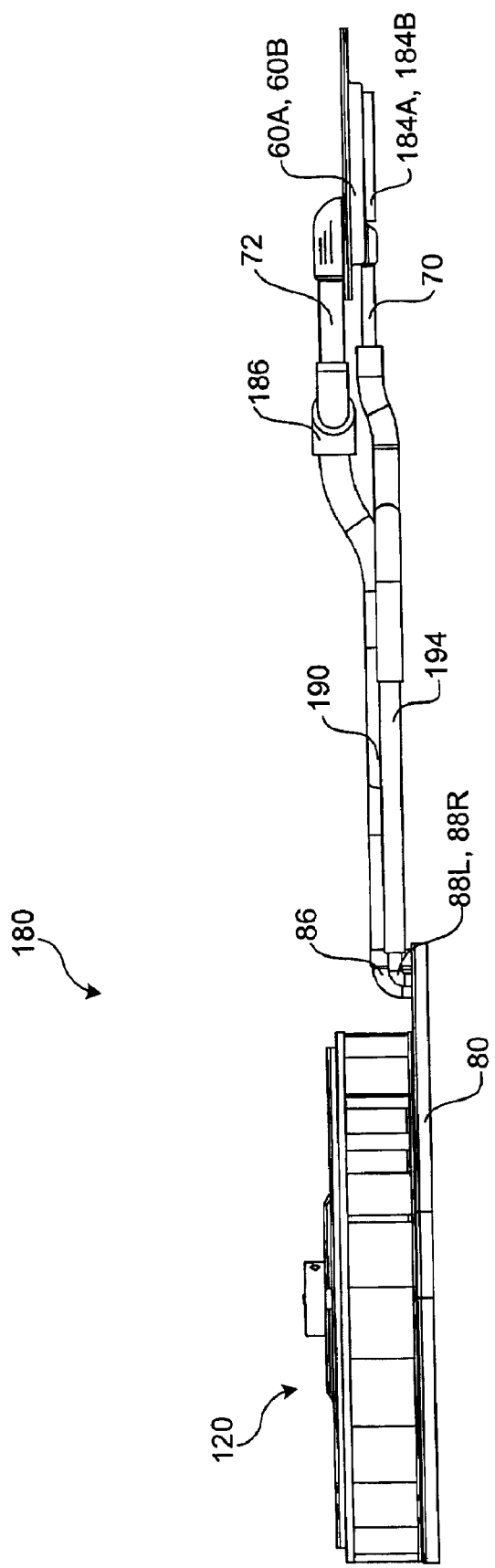
FIG. 9 is an elevational view of the components of the CPL cooling system of FIG. 8.

A first exemplary CPL system embodiment 180 in accordance with the present invention is shown in FIGS. 8 and 9. As shown in the FIG. 8, CPL system 180 may be implemented in a computer server housed in a 1U chassis 182. The computer system includes various computer circuitry and printed circuit boards (PCBs), including a pair of processors 184A and 184B coupled to modular processor boards. It is noted that several of the computer server's components, such as disk drives PCBs, electrical connectors, main board, etc. have been removed from the configuration shown in FIG. 8 for clarity. CPL system 180 includes a pair of evaporators 60A and 60B mounted to respective processors 184 such that the top surface of each processor is thermally coupled to a base 62 of the evaporator the processor is mounted to. In optional configurations, various heat transfer compounds may be used to enhance the thermal coupling between the evaporator base and the processor.

The vapor outlet ports 72 of the evaporators are commonly connected to a tee connection 186 through a pair of flexible vapor transport line portions 187 and 188. The common port of the tee connection is connected to a flexible vapor transport line 190, which has an outlet side that is connected to a vapor inlet port 86 of a condenser 80. Condenser 80 is part of a heat removal device 120, as described above with reference to FIGS. 5A and 5B. The liquid outlet ports 88L and 88R of condenser 80 are connected to first ends of respective liquid transport lines 192 and 194. The other end of liquid transport line 192 is connected to the liquid inlet port 70 of evaporator 60A, while the other end of liquid transport line 194 is connected to the liquid inlet port 70 of evaporator 60B.

An elevation view of CPL system 180 is shown in FIG. 9. It is important to recognize that the design of CPL systems in accordance with the invention must consider the elevational configuration of the component used in the system. Generally, rack-mounted servers, such as 1U and 2U servers, are configured as a plurality of servers stacked horizontally. As shown in FIG. 9, the condenser is located such that it has an elevation that is similar to that of the evaporator and transport lines. This reduces system pressure losses, increasing the efficiency of the system.

Figure 10:
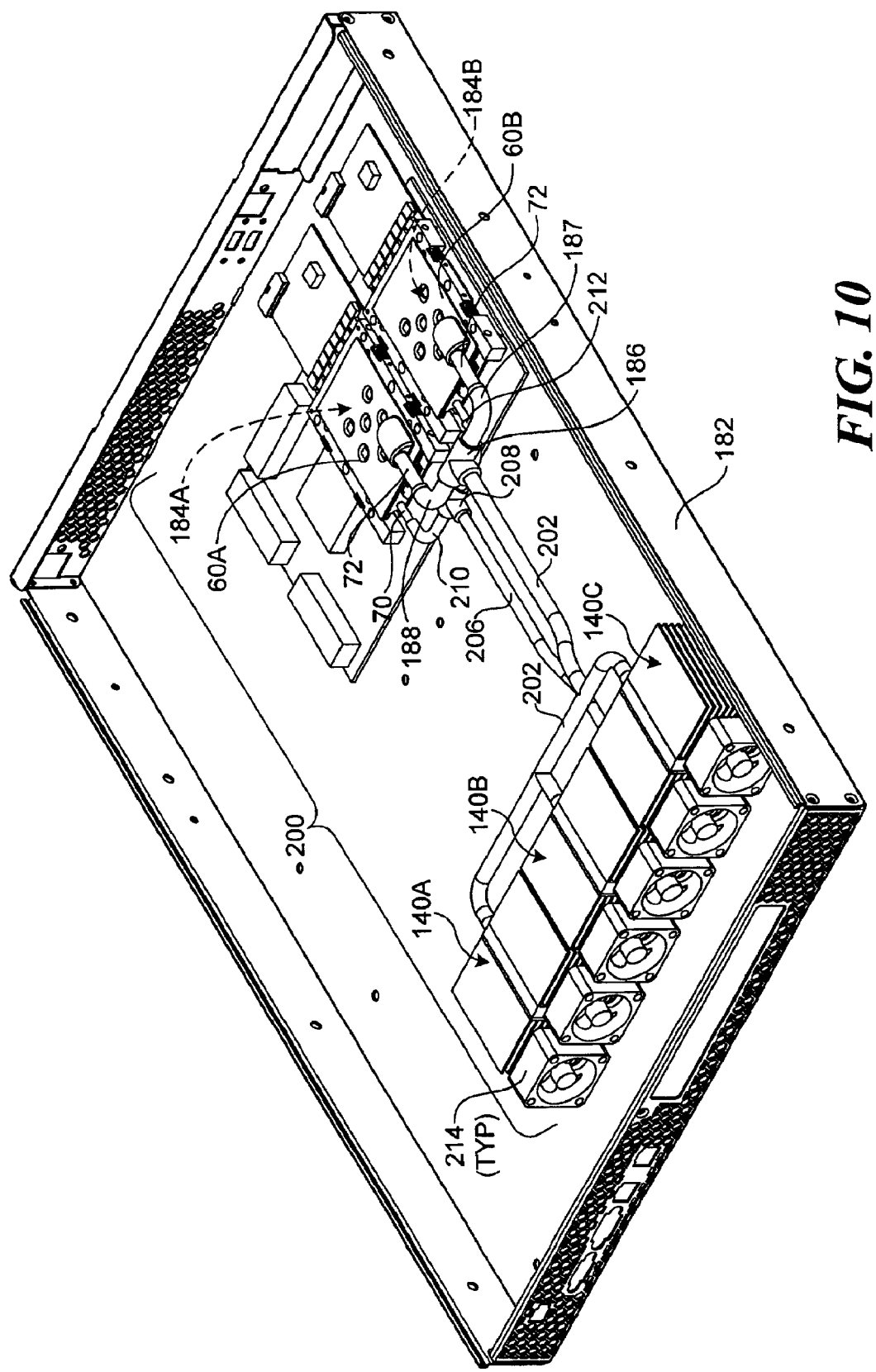
FIG. 10 is an isometric view of a 1U chassis in which a second exemplary CPL cooling system embodiment of the present invention is implemented.

A second CPL system embodiment 200 is shown FIG. 10. Many of the components in the right-hand portion of the 1U server are substantially the same as described above with reference to FIG. 8; accordingly, these components share the same reference numerals in both of FIGS. 8 and 10. CPL system 200 includes three condensers 140A, 140B, and 140C having configurations similar to that of condenser 140 discussed above with reference to FIGS. 6A and 6B. As with CPL system 180, vapor 26 exits evaporators 60A and 60B via vapor outlet ports 72, flowing into tee 186 via vapor transport lines 187 and 188. Tee 186 is connected to one end of a flexible vapor transport line 202. The other end of the vapor transport line is connected to a manifold 204, which divides the vapor into three portions. The output branches of manifold 204 are coupled to respective vapor inlet ports 146 of condensers 140A, 140B, and 140C. A similarly configured manifold (not shown) connects the liquid outlet ports 148 of the condensers to one end of a flexible liquid transport line 206, while the other end of the liquid transport line is connected to a tee 208. The branches of tee 208 are connected ends of respective liquid transport lines 210 and 212, while the ends of the liquid transport lines are connected to respective liquid inlet ports 70 of evaporators 60A and 60B.

CPL system 200 further includes a plurality of muffin fans 214. These fans are used to draw air across the fins of the condensers, thereby cooling the condensers and enhancing the heat removal capability of the system. Typically, muffin fans 214 will be located in an outer portion of the chassis.

Figure 11:
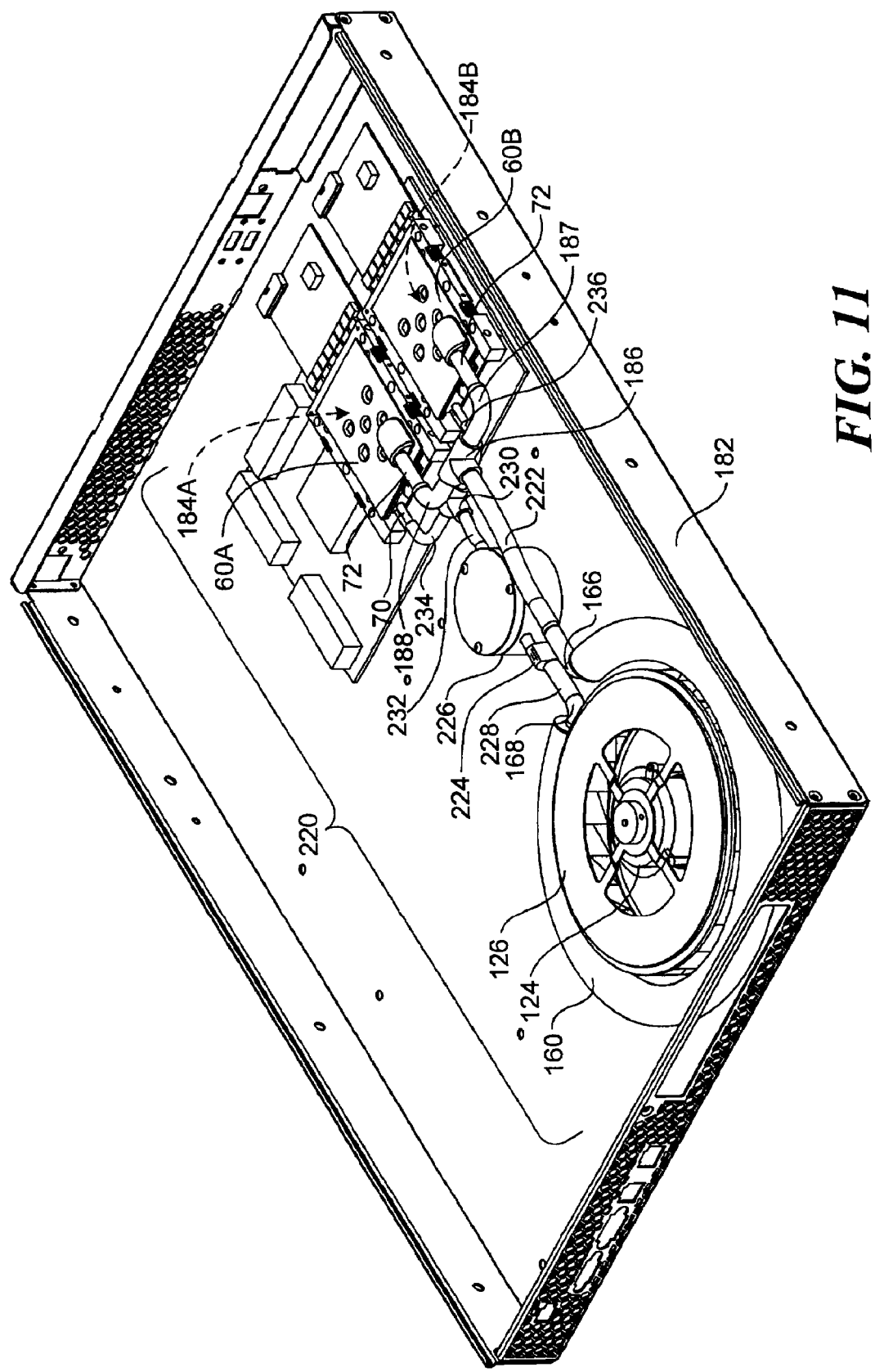
FIG. 11 is an isometric view of a 1U chassis computer server in which a third exemplary CPL cooling system embodiment of the present invention is implemented.
Figure 12:
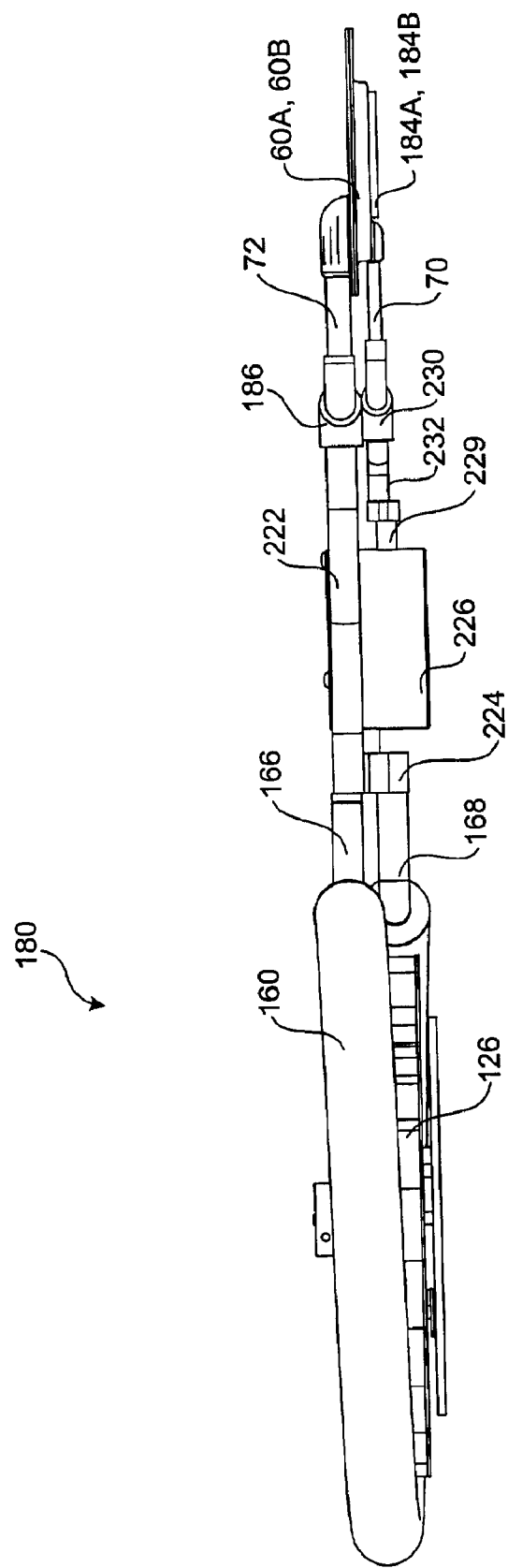
FIG. 12 is an elevational view of the components of the CPL cooling system of FIG. 11.

A third exemplary CPL system embodiment 220 is shown in FIGS. 11 and 12. Many of the components in the right-hand portion of FIG. 11 are similar to those used in CPL system 180 discussed above; these components share the same reference numbers in both FIGS. 8 and 11. As with CPL system 180, vapor 26 exits evaporators 60A and 60B via vapor outlet ports 72, flowing into tee 186 via vapor transport lines 186 and 187. Tee 186 is connected to one end of a flexible vapor transport line 222. The other end of the vapor transport line is connected to a vapor inlet port 166 of a condenser 160. A centrifugal fan 126 coupled to a motor 124 is disposed within condenser 160 and is used to cause air to flow over fins 164 to enhance the condensation function of the condenser when turned by the motor.

The liquid outlet port 168 of the condenser is connected to an inlet port 224 of a reservoir 226 via a liquid transport line 228. An outlet port 229 of the reservoir is connected to a tee 230 via a liquid transport line 232. The branches of tee 230 are connected to ends of respective liquid transport lines 234 and 236, while the ends of the liquid transport lines are connected to respective liquid inlet ports 70 of evaporators 60A and 60B.

The present invention provides several advantages over the prior art. For example, large heatsinks are commonly used in the prior art for cooling microprocessors. These heatsinks are often heavy and may be caused to vibrate in forced convention environments. Furthermore, in environments in which the chassis is caused to vibrate, such as rack-mount configurations in which multiple servers are mounted, the vibration and shocks induced to the chassis coupled with the weight of the heatsinks may damage the processor leads. By using flexible transport lines, vibration coupling between components may be dramatically reduced. Furthermore, since the CPL systems do not use large heatsinks but rather only have the evaporator component attached to the processors, the foregoing vibration problem may be reduced. Additionally, CPL systems enable the heat to be moved to locations in computer system chassis that are better configured for heat removal. As a result, higher density server configurations can be sufficiently cooled for high-reliability operations. The present invention also avoids some of the drawbacks of heat pipe systems. Notably, since CPL systems have a lesser amount of wicking structure, the pressure losses seen by the working fluid is reduced, thereby increasing heat capacity and maximum thermal transport distance.

Although the present invention has been described in connection with a preferred form of practicing it and modifications thereto, those of ordinary skill in the art will understand that many other modifications can be made to the invention within the scope of the claims that follow. Accordingly, it is not intended that the scope of the invention in any way be limited by the above description, but instead be determined entirely by reference to the claims that follow.

What is claimed is:

1. A capillary pump loop (CPL) cooling system, comprising:
   a first evaporator, adapted to be thermally coupled to a first semiconductor heat source, including a cavity in which a working fluid is evaporated from a liquid state into a vapor state and having a liquid inlet port to receive the working fluid in a liquid state and a vapor outlet port from which the working fluid exits the evaporator in a vapor state;
   a first wicking structure, having an input side to receive the working fluid in a liquid state and including a plurality of capillary channels to draw the working fluid into the evaporator through a capillary transport mechanism;
   a first condenser comprising
      a channeled base member having an external wall extending around a periphery thereof to which a cover plate is secured so as to define a sealed cavity, and further including a pair of internal walls, each internal wall including a portion disposed substantially adjacent to a portion of the external wall so as to define a capillary channel, said pair of internal walls dividing the sealed cavity into a condensing region and the capillary channels,
      a vapor inlet port to receive a working fluid in a vapor state operatively coupled to the sealed cavity, and
      a first liquid output port from which the working fluid exits the condenser, operatively coupled to an outlet ends of the capillary channels;
   a vapor transport line operatively coupling the vapor output port of the evaporator to the vapor inlet port of the condenser; and
   a liquid transport line operatively coupling the liquid output port of the condenser to the liquid inlet port of the evaporator.

2. The CPL cooling system of claim 1, wherein the first wicking structure is disposed within the cavity in the evaporator.

3. The CPL cooling system of claim 1, wherein the first condenser further includes in internal cavity in which a volume of the working fluid is maintained in its liquid state, thereby functioning as a reservoir in addition to a condenser.

4. The CPL cooling system of claim 1, further comprising a reservoir having an inlet operatively coupled to the liquid outlet port of the first condenser via a first portion of the liquid transport line and an outlet operatively coupled to the liquid inlet port of the evaporator via a second portion of the liquid transport line.

5. The CPL cooling system of claim 1, wherein the first wicking structure comprises a volume of a sintered material.

6. The CPL cooling system of claim 5, wherein the sintered material comprises a sintered copper.

7. The CPL cooling system of claim 1, wherein in first wicking structure comprises a piece of meshed material disposed within the evaporator.

8. The CPL cooling system of claim 1, further comprising:
   a second evaporator adapted to be thermally coupled to a second semiconductor heat source, including a cavity in which a working fluid is evaporated from a liquid state into a vapor state and having a liquid inlet port to receive a portion of the working fluid in a liquid state and a vapor outlet port from which a portion of the working fluid exits the evaporator in a vapor state;
   a second wicking structure, having an input side to receive the working fluid in a liquid state and including a plurality of capillary channels to draw the working fluid into the evaporator through a capillary transport mechanism;
   a vapor transport line connection segment operatively coupling the vapor outlet port of the second evaporator to the vapor transport line; and
   a liquid transport line connection segment operatively coupling the liquid inlet port of the second evaporator to the liquid transport line.

9. The CPL cooling system of claim 1, further comprising a heatsink thermally coupled to the condenser.

10. The CPL cooling system of claim 9, further comprising a fan disposed relative to the heatsink so as to draw air across the heatsink when the fan is operated.

11. The CPL cooling system of claim 1, wherein the working fluid comprise water.

12. The CPL cooling system of claim 1, further comprising:
   a second condenser to condense a portion of the working fluid front a vapor state into a liquid state, having a vapor inlet port to receive the working fluid in its vapor state and a liquid outlet port from which the working fluid exits the condenser in its liquid state;
   a vapor transport line connection segment operatively coupling the vapor inlet port of the second condenser to the vapor transport line; and
   a liquid transport line connection segment operatively coupling the liquid output port of the second condenser to the liquid transport line.

13. The CPL cooling system of claim 1, wherein at least a portion of each of the liquid transport line and the vapor transport line is flexible.

14. The CPL cooling system of claim 1, wherein the components of the cooling system are configured to operate in a computer server having a 1U form factor.

15. A capillary pump loop (CPL) cooling system, comprising:
   a first evaporator including:
      a base having a substantially flat bottom with a peripheral wall around the perimeter thereof, wherein the base and the peripheral wall define a cavity and wherein the bottom is configured to be thermally coupled to a semiconductor heat source, a top cover secured to the peripheral wall so as to define a sealed volume in which a working fluid is vaporized, a liquid inlet port operatively coupled to the sealed volume to receive the working fluid in a liquid state, a vapor liquid output port operatively coupled to the sealed volume from which the working fluid exits the evaporator in a vapor state, and a wicking structure, disposed within a portion of the cavity, having a top surface on which a meniscus of the working fluid is formed and a bottom surface into which the working fluid is drawn through a capillary mechanism and a pressure differential between a pressure of the working fluid in the meniscus and a pressure of vaporized working fluid in the sealed volume;

a first condenser to condense the working fluid from a vapor state into a liquid state, having a vapor inlet port to receive the working fluid in its vapor state and a liquid outlet port from which the working fluid exits the condenser in its liquid state;

a vapor transport line operatively coupling the vapor output port of the evaporator to the vapor inlet port of the condenser; and a liquid transport line operatively coupling the liquid output port of the condenser to the liquid inlet port of the evaporator.

16. The CPL cooling system of claim 15, wherein the first condenser further includes in internal cavity in which a volume of the working fluid is maintained in its liquid state, thereby functioning as a reservoir in addition to a condenser.

17. The CPL cooling system of claim 15, further comprising a reservoir having an inlet operatively coupled to the liquid outlet port of the first condenser via a first portion of the liquid transport line and an outlet operatively coupled to the liquid inlet port of the evaporator via a second portion of the liquid transport line.

18. The CPL cooling system of claim 15, wherein the first wicking structure comprises a volume of a sintered material.

19. The CPL cooling system of claim 18, wherein the sintered material comprises a sintered copper.

20. The CPL cooling system of claim 15, wherein in first wicking structure comprises a piece of meshed material disposed within the evaporator.

21. The CPL cooling system of claim 15, further comprising:

a second evaporator adapted to be thermally coupled to a second semiconductor heat source, including a cavity in which a working fluid is evaporated from a liquid state into a vapor state and having a liquid inlet port to receive a portion of the working fluid in a liquid state and a vapor outlet port from which a portion of the working fluid exits the evaporator in a vapor state;

a second wicking structure, having an input side to receive the working fluid in a liquid state and including a plurality of capillary channels to draw the working fluid into the evaporator through a capillary transport mechanism;

a vapor transport line connection segment operatively coupling the vapor outlet port of the second evaporator to the vapor transport line; and a liquid transport line connection segment operatively coupling the liquid inlet port of the second evaporator to the liquid transport line.

22. The CPL cooling system of claim 15, further comprising a heatsink thermally coupled to the condenser.

23. The CPL cooling system of claim 22, further comprising a fan disposed relative to the heatsink so as to draw air across the heatsink when the fan is operated.

24. The CPL cooling system of claim 15, wherein the working fluid comprise water.

25. The CPL cooling system of claim 15, further comprising:

a second condenser to condense a portion of the working fluid from a vapor state into a liquid state, having a vapor inlet port to receive the working fluid in its vapor state and a liquid outlet port from which the working fluid exits the condenser in its liquid state;

a vapor transport line connection segment operatively coupling the vapor inlet port of the second condenser to the vapor transport line; and a liquid transport line connection segment operatively coupling the liquid output port of the second condenser to the liquid transport line.

26. The CPL cooling system of claim 15, wherein at least a portion of each of the liquid transport line and the vapor transport line is flexible.

27. The CPL cooling system of claim 15, wherein the components of the cooling system are configured to operate in a computer server having a 1U form factor.

28. The CPL cooling system of claim 15, further comprising posts connected to the bottom and extending substantially between to bottom and the top cover.

29. The CPL cooling system of claim 15, further comprising dimples in the top cover which extend substantially between the top cover and the bottom.

* * * * *